United States Patent
Liu et al.

(10) Patent No.: US 11,519,939 B2
(45) Date of Patent: Dec. 6, 2022

(54) CURRENT SENSOR INTEGRATED CIRCUITS

(71) Applicant: Allegro MicroSystems, LLC, Manchester, NH (US)

(72) Inventors: Shixi Louis Liu, Hooksett, NH (US); Paul A. David, Bow, NH (US); Shaun D. Milano, Charlestown, NH (US); Rishikesh Nikam, Manchester, NH (US); Alexander Latham, Harvard, MA (US); Wade Bussing, Manchester, NH (US); Natasha Healey, Bedford, NH (US); Georges El Bacha, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/472,769

(22) Filed: Sep. 13, 2021

(65) Prior Publication Data

US 2021/0405092 A1 Dec. 30, 2021

Related U.S. Application Data

(60) Division of application No. 16/884,311, filed on May 27, 2020, now Pat. No. 11,150,273, which is a
(Continued)

(51) Int. Cl.
*H01L 21/44* (2006.01)
*G01R 15/08* (2006.01)
(Continued)

(52) U.S. Cl.
CPC .............. *G01R 15/08* (2013.01); *H01L 43/04* (2013.01); *H01L 43/065* (2013.01)

(58) Field of Classification Search
CPC . H01L 23/495; H01L 23/49575; H01L 23/28; H01L 23/3135; H01L 23/3192; H01L 21/56
(Continued)

(56) References Cited

U.S. PATENT DOCUMENTS 6,072,231 A 6/2000 Murakami et al.
6,630,726 B1 10/2003 Crowley et al.
(Continued)

FOREIGN PATENT DOCUMENTS

EP 2 500 939 9/2012

OTHER PUBLICATIONS

International Preliminary Report on Patentability dated Jul. 28, 2022 for PCT Application No. PCT/US2020/065949; 9 pages.
(Continued)

*Primary Examiner* — Nitin Parekh
(74) *Attorney, Agent, or Firm* — Daly, Crowley, Mofford & Durkee, LLP

(57) ABSTRACT

A current sensor integrated circuit (IC) includes a unitary lead frame having at least one first lead having a terminal end, at least one second lead having a terminal end, and a paddle having a first surface and a second opposing surface. A semiconductor die is supported by the first surface of the paddle, wherein the at least one first lead is electrically coupled to the semiconductor die and the at least one second lead is electrically isolated from the semiconductor die. The current sensor IC further includes a first mold material configured to enclose the semiconductor die and the paddle and a second mold material configured to enclose at least a portion of the first mold material, wherein the terminal end of the at least one first lead and the terminal end of the at least one second lead are external to the second mold material.

8 Claims, 12 Drawing Sheets

Related U.S. Application Data continuation-in-part of application No. 16/746,275, filed on Jan. 17, 2020, now Pat. No. 11,183,436.

(51) Int. Cl.
*H01L 43/04* (2006.01)
*H01L 43/06* (2006.01)

(58) Field of Classification Search
USPC .................................. 438/124; 257/666, 790
See application file for complete search history.

(56) References Cited

U.S. PATENT DOCUMENTS

| | | | |
|---|---|---|---|
| 6,781,359 B2 | 8/2004 | Stauth et al. | |
| 7,245,007 B1 * | 7/2007 | Foster | H01L 23/49527 |
| | | | 257/E23.047 |
| 7,265,531 B2 | 9/2007 | Stauth et al. | |
| 7,709,754 B2 | 5/2010 | Doogue et al. | |
| 7,768,083 B2 | 8/2010 | Doogue et al. | |
| 7,816,772 B2 | 10/2010 | Engel et al. | |
| 7,816,905 B2 | 10/2010 | Doogue et al. | |
| 8,008,758 B1 * | 8/2011 | Kim | H01L 23/49541 |
| | | | 257/E23.047 |
| 8,143,169 B2 | 3/2012 | Engel et al. | |
| 8,422,243 B2 | 4/2013 | Chow et al. | |
| 8,749,977 B2 | 6/2014 | Asada et al. | |
| 8,907,437 B2 | 12/2014 | Milano et al. | |
| 9,081,041 B2 | 7/2015 | Friedrich et al. | |
| 9,190,606 B2 | 11/2015 | Liu et al. | |
| 9,228,860 B2 | 1/2016 | Sharma et al. | |
| 9,411,025 B2 | 8/2016 | David et al. | |
| 9,494,660 B2 | 11/2016 | David et al. | |
| 9,666,788 B2 | 5/2017 | Taylor et al. | |
| 9,704,789 B1 | 7/2017 | Suh et al. | |
| 9,716,057 B1 | 7/2017 | Zhang et al. | |
| 9,812,588 B2 | 11/2017 | Vig et al. | |
| 9,865,807 B2 | 1/2018 | Liu et al. | |
| 9,958,482 B1 | 5/2018 | Latham | |
| 10,234,513 B2 | 3/2019 | Vig et al. | |
| 10,345,343 B2 | 7/2019 | Milano et al. | |
| 10,352,969 B2 | 7/2019 | Milano et al. | |
| 10,481,181 B2 | 11/2019 | Bussing et al. | |
| 10,718,794 B2 | 7/2020 | El Bacha et al. | |
| 10,753,963 B2 | 8/2020 | Milano et al. | |
| 11,150,273 B2 | 10/2021 | Liu et al. | |
| 2004/0080028 A1 | 4/2004 | Yanagisawa | |
| 2007/0284720 A1 | 12/2007 | Otremba et al. | |
| 2008/0211068 A1 | 9/2008 | Chen et al. | |
| 2009/0127677 A1 | 5/2009 | Gomez | |
| 2010/0164078 A1 | 7/2010 | Madrid et al. | |
| 2010/0253435 A1 | 10/2010 | Ichitsubo et al. | |
| 2011/0284989 A1 * | 11/2011 | Umeno | H01L 23/49531 |
| | | | 257/E27.024 |
| 2012/0104588 A1 | 5/2012 | Chen et al. | |
| 2014/0036471 A1 | 2/2014 | Yuen et al. | |
| 2014/0131843 A1 | 5/2014 | Balakrishnan et al. | |
| 2014/0133186 A1 | 5/2014 | Balakrishnan et al. | |
| 2014/0232015 A1 * | 8/2014 | Otremba | H01L 24/73 |
| | | | 257/777 |
| 2016/0233149 A1 | 8/2016 | Otremba et al. | |
| 2016/0377689 A1 * | 12/2016 | Babulano | H01L 43/02 |
| | | | 324/252 |
| 2017/0179009 A1 | 6/2017 | Otremba et al. | |
| 2017/0229383 A1 | 8/2017 | Fernando et al. | |
| 2018/0061745 A1 | 3/2018 | Otremba et al. | |
| 2019/0157177 A1 | 5/2019 | Ichimura | |
| 2019/0285667 A1 | 9/2019 | Milano et al. | |
| 2020/0025804 A1 | 1/2020 | Bussing et al. | |
| 2021/0225721 A1 | 7/2021 | Liu et al. | |

OTHER PUBLICATIONS

U.S. Appl. No. 16/887,045, filed May 29, 2020, Latham.

Allegro MicroSystems, LLC datasheet A6214 and A6216 "Automotive-Grade, Constant-Current 2 A PWM Dimmable Buck Regulator LED Driver", Nov. 1, 2016; 25 pages.

PCT Search Report and Written Opinion dated Apr. 23, 2021 for PCT Application No. PCT/US2020/065949; 15 pages.

U.S. Non-Final Office Action dated Jul. 19, 2021 for U.S. Appl. No. 16/746,275; 21 Pages.

Response to Office Action filed Sep. 9, 2021 for U.S. Appl. No. 16/746,275; 13 pages.

Notice of Allowance dated Oct. 1, 2021 for U.S. Appl. No. 16/746,275; 17 pages.

Notice of Allowance dated Aug. 18, 2021 for U.S. Appl. No. 16/884,311; 14 pages.

\* cited by examiner

CURRENT SENSOR INTEGRATED CIRCUITS

CROSS-REFERENCE TO RELATED APPLICATIONS

This application is a Divisional of and claims priority to and the benefit of U.S. patent application Ser. No. 16/884,311, entitled "Current Sensor Integrated Circuits" and filed on May 27, 2020, which is a continuation-in-part of and claims priority to and the benefit of U.S. U.S. patent application Ser. No. 16/746,275, entitled "Power Module Package and Packaging Techniques" and filed on Jan. 17, 2020, the entirety of which are hereby incorporated by reference.

STATEMENT REGARDING FEDERALLY SPONSORED RESEARCH

Not Applicable.

FIELD

This invention relates generally to current sensor integrated circuits and more particularly to packaging structures and techniques for current sensor integrated circuits.

BACKGROUND

Some electrical current sensors use one or more magnetic field sensing elements in proximity to a current-carrying conductor. The magnetic field sensing elements generate an output signal having a magnitude proportional to the magnetic field induced by the current through the conductor.

In applications in which the conductor can be at a relatively high voltage, safety specifications require that a certain electrical isolation be maintained between the conductor and other parts of the circuitry (e.g., signal leads coupled to an external system on which the sensor output signal is communicated). The term "creepage" refers to the shortest distance between two conductive parts along the surface of any insulation material common to two conductive parts. The creepage requirement is based on the distance necessary to withstand a given working voltage (i.e., the highest voltage level that insulation under consideration can be subjected to when the current sensor is operating in normal use).

Various parameters characterize the performance of such current sensors, including sensitivity. Sensitivity is related to the magnitude of a change in output voltage from the magnetic field transducer in response to a sensed current. The sensitivity of a current sensor is related to a variety of factors. One important factor is the physical separation between the magnetic field transducer/sensor and the current conductor, sometimes referred to as the "active area depth".

Current sensing accuracy can also be affected by mechanical dimensional/positional tolerance considerations. Accuracy is improved by providing tightly controllable, repeatable manufacturing structures and techniques for the sensor. Some current sensors require different components or subassemblies to be manually positioned and/or aligned during the manufacturing process, which can introduce misalignments that adversely affect sensing accuracy.

SUMMARY

Described herein are structures and manufacturing methods directed towards providing current sensor integrated circuits (ICs) that meet creepage requirements for high voltage applications with a reduced active area depth by down setting a paddle of the IC lead frame. The described current sensor IC is provided with tighter manufacturing tolerances as a result of improved coplanarity of the lead frame and avoiding manual alignment requirements during manufacture by utilizing a unitary lead frame. By providing current sensor ICs with these attributes, current sensing accuracy is improved.

According to the disclosure, a current sensor integrated circuit includes a unitary lead frame including at least one first lead having a terminal end, at least one second lead having a terminal end, and a paddle having a first surface and a second opposing surface. A semiconductor die is supported by the first surface of the paddle, wherein the at least one first lead is electrically coupled to the semiconductor die and the at least one second lead is electrically isolated from the semiconductor die. A first mold material is configured to enclose the semiconductor die and the paddle and a second mold material configured to enclose at least a portion of the first mold material, wherein the terminal end of the at least one first lead and the terminal end of the at least one second lead are external to the second mold material.

Features may include one or more of the following individually or in combination with other features. In some embodiments, the second mold material may be configured to fully enclose the first mold material. In other embodiments, the second mold material is configured to enclose a portion of the first mold material and to expose a surface of the first mold material. The paddle can be supported by the at least one first lead. The lead frame can include at least one dummy lead that is electrically isolated from the semiconductor die, wherein the paddle is supported by the at least one dummy lead.

The paddle can be down set with respect to the terminal end of each of the at least one first lead and the terminal end of the at least one second lead. A distance of the down set of the paddle is based on an active area depth and creepage distance requirements of the sensor IC.

The at least one first lead has a first portion extending from an edge of the second mold material outside of the second mold material in a first direction and a second portion enclosed by the second mold material and extending from the edge of the second mold material inside the second mold material in a second direction to the down set paddle, wherein the second direction can be substantially opposite to the first direction. The second mold material has a first surface, a second surface parallel to the first surface, and a side surface extending from the first surface to the second surface, wherein the first and second portions of the at least one first lead meet at a junction between a first portion of the second mold material and a second portion of the second mold material positioned at the side surface of the second mold material.

In use, the first surface of the second mold material can be adjacent to a current conductor external to the current sensor IC. A distance from the first surface of the second mold material to the second surface of the second mold material establishes a thickness of the sensor IC and the thickness can be selected based on a creepage requirement of the sensor IC. The at least one first lead can extend external to the second mold material on a first side of the second mold material and the at least one second lead can extend external to the second mold material on at least one second side of the second mold material orthogonal with respect to the first side. The terminal end of the at least one first lead and the terminal end of the at least one second lead can be configured for surface mount attachment. The at least one first lead can be electrically coupled to the semiconductor die by a wire bond.

Also described is a method of manufacturing a current sensor IC including providing a lead frame including at least one first lead having a terminal end, at least one second lead having a terminal end, and a paddle and attaching a semiconductor die to the paddle. The at least one first lead is electrically coupled to the semiconductor die and the at least one second lead is electrically isolated from the semiconductor die. The method further includes molding a first mold material to enclose the semiconductor die and the paddle, forming the at least one first lead to down set the paddle with respect to the terminal end of the at least one first lead, molding a second mold material to enclose at least a portion of the first mold material and to expose the terminal end of the at least one first lead and the terminal end of the at least one second lead, and forming the terminal end of at least one first lead and the terminal end of the at least one second lead for surface mount attachment.

Features may include one or more of the following individually or in combination with other features. The lead frame can be provided from a unitary, coplanar lead frame strip. The lead frame can further include at least two dam bars configured to attach the lead frame to one or more lead frames of other current sensor ICs, wherein the method further includes removing at least one dam bar after molding the first mold material and before forming the at least one first lead to down set the paddle with respect to the terminal end of the at least one first lead. The method can further include removing at least one dam bar after molding the second mold material. In some embodiments, molding the second mold material to enclose at least a portion of the first mold material can include enclosing all surfaces of the first mold material. In other embodiments, molding the second mold material to enclose at least a portion of the first mold material can include exposing a surface of the first mold material. Molding the first mold material can include placing the lead frame and the semiconductor die into a first chase comprising a first cavity and a second cavity and introducing the first mold material through an opening in the first chase, wherein the at least one first lead extends external to the first mold material at a junction between the first cavity and the second cavity. Molding the second mold material can include placing the lead frame and the first mold material into a second chase including a first cavity and a second cavity and introducing the second mold material through an opening in the second chase, wherein the at least one first lead and the at least one second lead extend external to the second mold material at a junction between the first cavity and the second cavity.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
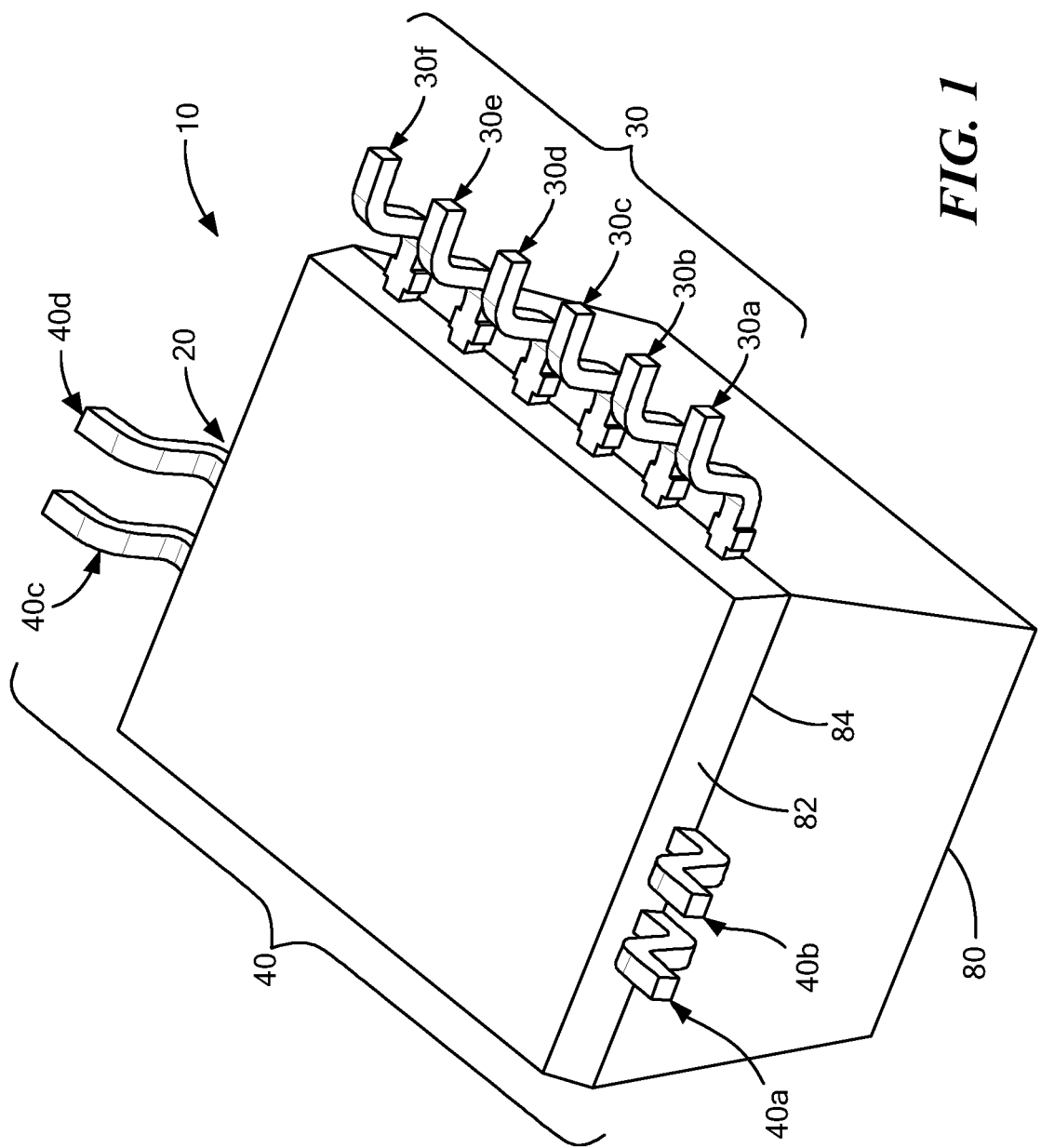
FIG. 1 is an isometric view of a current sensor IC package according to the disclosure.
Figure 1A:
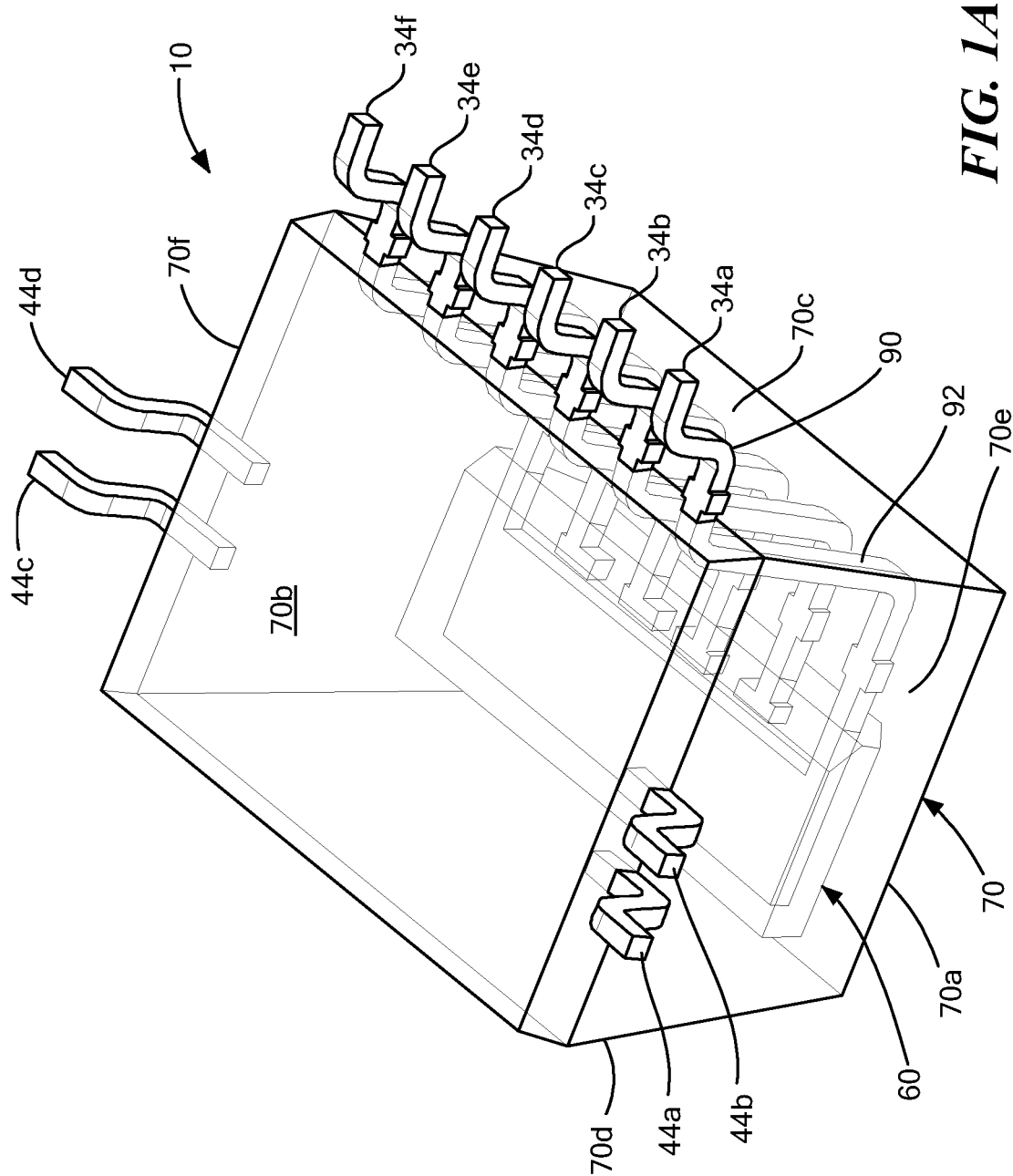
FIG. 1A is a transparent view of the current sensor IC of FIG. 1.
Figure 1B:
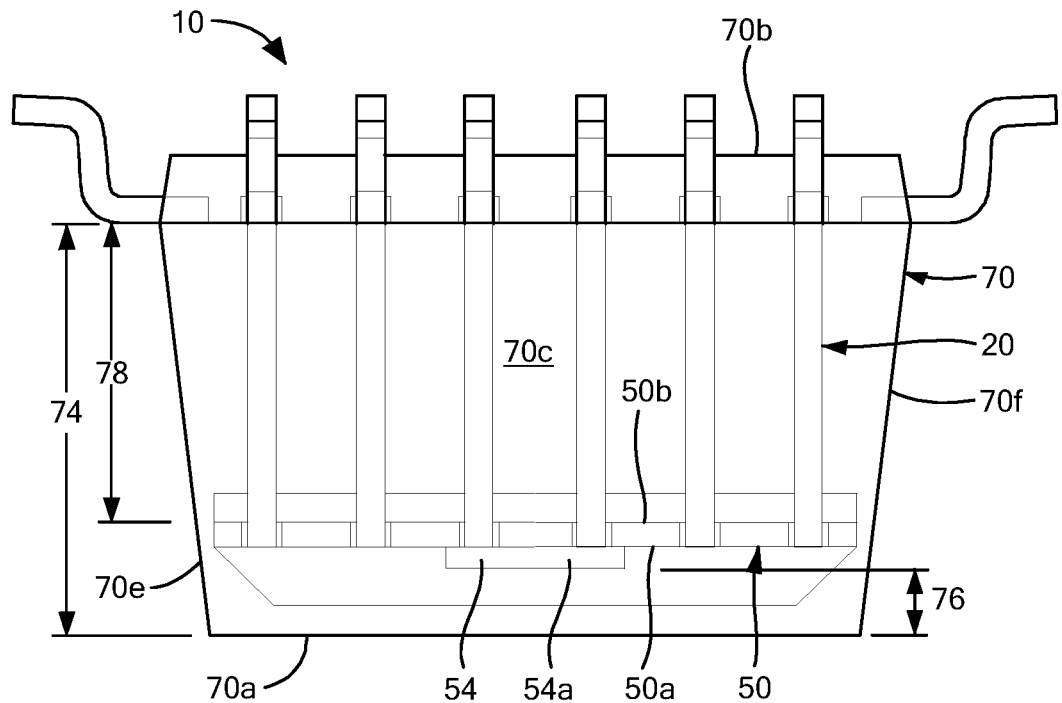
FIG. 1B is a side view of the current sensor IC of FIG. 1.

Referring to FIGS. 1, 1A, and 1B, a current sensor IC 10 includes a unitary lead frame 20 having at least one first lead 30 (and here six leads 30a-30f), at least one second lead 40 (and here four leads 40a-40d), and a paddle 50 having a first surface 50a and a second, opposing surface 50b. Each of the first leads 30a-30f has a respective terminal end 34a-34f and each of the second leads 40a-40d has a respective terminal end 44a-44d. A semiconductor die 54 is supported by the first surface 50a of the paddle 50. The first leads 30a-30f are electrically coupled to the semiconductor die 54 and the second leads 40a-40d are electrically isolated from the semiconductor die.

A first mold material 60 is configured to enclose the semiconductor die 54 and the paddle 50 and a second mold material 70 is configured to enclose at least a portion of the first mold material 60. The second mold material 70 can be considered to form a package or package body from which lead portions can extend to permit electrical or other connection to external circuits and systems as will become apparent. The terminal ends 34a-34f of the first leads 30a-30f and the terminal ends 44a-44d of the second leads 40a-40d are external to the second mold material 70.

The second mold material 70 has a first surface 70a, a second surface 70b parallel to the first surface, and side surfaces 70c-70f extending from the first surface to the second surface, as shown. In the example sensor 10, first leads 30a-30f extend external to the second mold material 70 on a first side 70c of the second mold material and second leads 40a-40d extend external to the second mold material 70 on a side (i.e., mold material side 70e and/or side 70f) of the second mold material orthogonal with respect to the first side.

The semiconductor die 54 is configured to support one or more magnetic field sensing elements (see FIG. 10) to detect a magnetic field generated by a current in a proximate, external conductor as shown and described below in connection with FIGS. 9 and 9A. Suffice it to say here that in use, the current sensor 10 is positioned with respect to an external conductor such that the surface 70a of the second mold material is proximate to the conductor.

A distance labeled 74 from the first surface 70a of the second mold material 70 to exposed portions of the leads 30a-30f, 40a-40d corresponds to the creepage of the sensor IC 10 as it represents the minimum distance between an external conductor and the leads through the second mold material. In an example sensor, the creepage requirement can be on the order of 5 mm for a 450V application or 9 mm for a 900V application.

In order to achieve a relatively small active area depth, it is desirable for an active surface 54a of the die 54 (i.e., the surface that supports magnetic field sensing elements) to be close to the conductor and thus, close to the surface 70a of the second mold material 70 that is proximate to the conductor in use. The distance from the active die surface 54a to the conductor can be as small as the distance labelled 76 in FIG. 1B in applications in which the package surface 70a is flush against the conductor.

Satisfying the competing requirements of providing a small active area depth 76 while also establishing a required minimum creepage distance labeled 74 in FIG. 1B can be challenging. In order to address these competing requirements, paddle 50 is "down set" with respect to the terminal ends 34a-34f of the first leads 30a-30f and the terminal ends 44a-44d of the second leads 40a-40d, as shown. As will become apparent in connection with FIGS. 4 and 4A below, the paddle 50 is down set after a primary package 200 (FIG. 2) of the sensor IC 10 is molded and a dam bar is removed. The down set distance labeled 78 refers to the distance between the paddle 50 and a portion of the leads 30a-30f extending external to the second mold material. It will be appreciated that the down set distance 78 can be selected to achieve a desired active area depth 76 and required creepage distance 74 for the current sensor 10.

As will be discussed below, the second mold material 70 has a first portion 80 and a second portion 82, which portions meet at a junction, or parting line 84 shown along the side surfaces 70c-70f. As can be seen in FIG. 1A and labeled with respect to example lead 30a, each of the leads 30a-30f and 40a-40d has first, external portion 90 extending from an side surface 70c of the second mold material 70 outside of the second mold material (i.e., external to the package) in a first direction (i.e., generally upward in the view of FIG. 1A) and a second, internal portion 92 enclosed by the second mold material and extending from the side surface 70c of the second mold material 70 inside the second mold material in a second direction (i.e., generally downward the view of FIG. 1A) to the down set paddle 50, with the second direction being substantially opposite to the first direction. The first and second directions in which the leads 30a-30f extend can be substantially vertical with respect to the IC 10 as illustrated. With this arrangement of first, external lead portions (e.g., 90) extending in a different, substantially vertical direction than second, internal lead portions (e.g., 92), which second, internal lead portions extend to the down set paddle 50, a current conductor (FIG. 9) can be attached or otherwise positioned proximate to the first surface 70a of mold material 70 without interference or restriction by lead connections.

Second mold material 70 can be considered to form the IC package 10 from which the external portion of the leads extend in order to permit electrical connection to other circuits and systems (not shown). Various arrangements are possible for connecting the leads 30a-30f to external components and systems. The example sensor 10 is configured for surface mount attachment to a printed circuit board or other suitable substrate and so, the terminal ends 34a-34f of leads 30a-30f are formed and plated for surface mount attachment. It will be appreciated by those of skill in the art that the terminal ends 34a-34f of leads 30a-30f can alternatively be provided for other types of circuit board attachment such as through hole attachment for example. Leads 44a-44d are also formed and plated for surface mount attachment and, while leads 44a-44d are not electrically connected to sensor circuitry, they are instead provided to enhance mechanical mounting stability by balancing the package when the IC is attached to a circuit board by surface mount technology (see e.g., FIG. 9).

In current sensor 10 of FIGS. 1, 1A, 1B, the second mold material 70 is configured to fully enclose the first mold material 60 as shown in FIG. 1B. In other embodiments, as shown and described in connection with FIG. 7 below, the second mold material 70 is configured to enclose only a portion of the first mold material 60 and to expose a surface of the first mold material.

Figure 2:
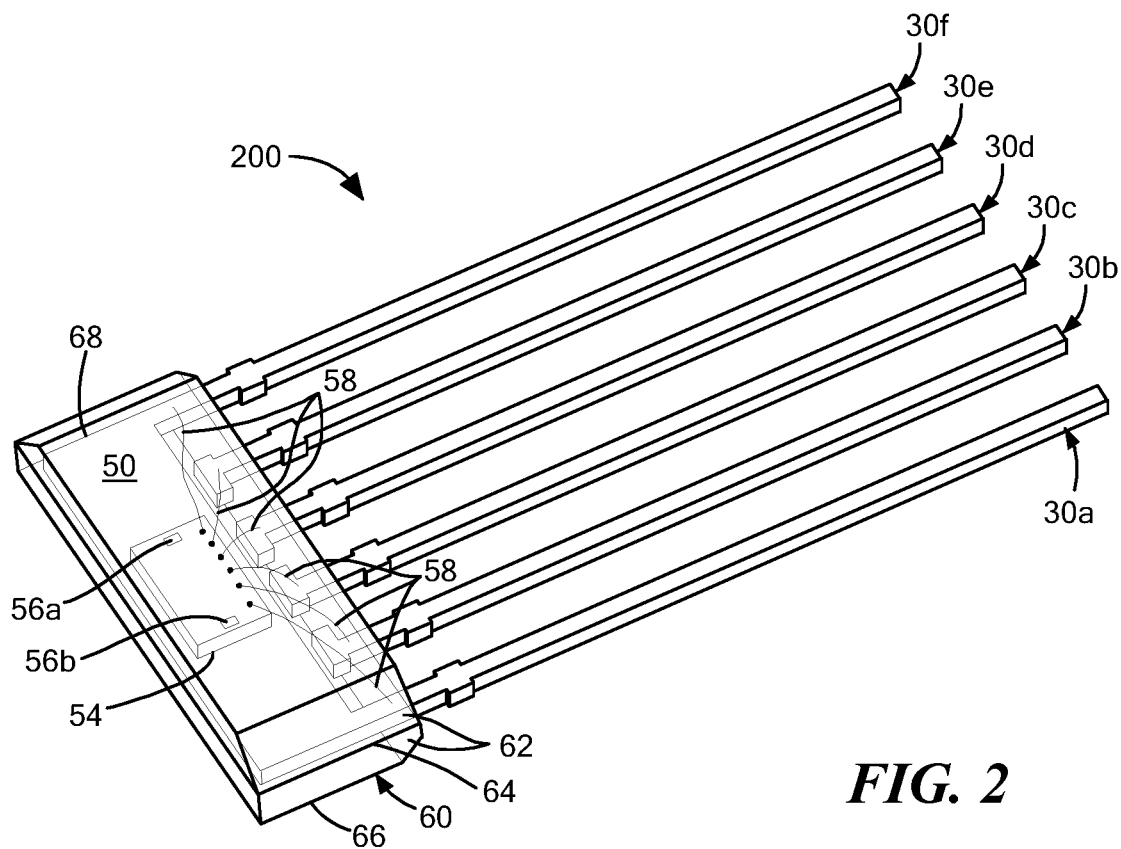
FIG. 2 is an isometric view of a primary package of the current sensor IC of FIG. 1.

Referring also to FIG. 2, a primary package 200 that forms part of the current sensor IC 10 includes a first portion of lead frame 20 (including first leads 30a-30f and paddle 50), semiconductor die 54, and first mold material 60. The first mold material 60 encloses the semiconductor die 54 and the paddle 50, as shown. The primary package 200 has a form similar to a single in-line package (SIP).

Semiconductor die 54 supports magnetic field sensing elements (e.g., sensing elements 56a, 56b) and other elements and circuitry to permit current detection as will be explained in connection with the example current sensor of FIG. 10. In order to permit electrical connection between the current sensor IC 10 and external circuits and systems, one or more of the first leads 30a-30f are coupled to the semiconductor die 54. Various structures and techniques are suitable for permitting such electrical connection, such as the illustrated wire bonds 58 that can be coupled between bond pads on the semiconductor die 54 and the signal leads 30a-30f. The wire bonds 58 and a portion of the electrically connected leads are enclosed by the first mold material 60, as shown.

Paddle 50 is supported by at least one first lead 30a-30f and, in the example embodiment is supported by leads 30a, 30f, as may provide an electrical ground connection for the IC 10. Additionally, as shown in connection with FIG. 3, the lead frame 20 may include one or more "dummy" leads, or tie bars (i.e., leads that are not electrically connected within the package 10 and thus are electrically isolated from the semiconductor die 54) which may additionally support the paddle 50.

Fabrication of the primary package 200 is discussed below in connection with FIGS. 4 and 8. Suffice it to say here that the first mold material 60 includes a first portion 66 and a second portion 68, which portions meet at a junction, or parting line 64. Tapers 62 of the first and second mold portions 66, 68 can facilitate removal from mold chases.

Figure 3:
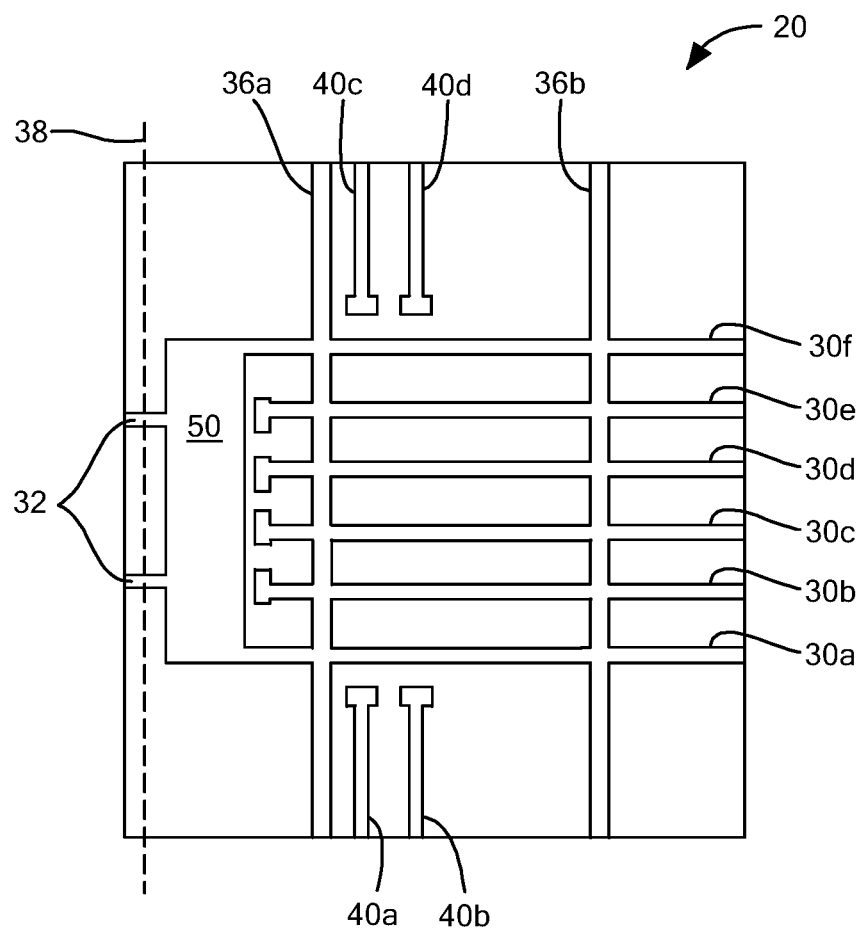
FIG. 3 is a plan view of the lead frame at a stage of manufacture of the current sensor IC of FIG. 1.

Fabrication of IC 10 is described in connection with FIGS. 3-8. Referring to FIG. 3, lead frame 20 is shown at a stage of manufacture to include first leads 30a-30f, second leads 40a-40d, paddle 50, tie bars 32, and dam bars 36a, 36b. Tie bars 32 and dam bars 36a, 36b facilitate manufacture by maintaining lead frame coplanarity and desired lead spacing and also providing a stopping point for liquid molding compound during processing and also enhance the strength of the resulting lead frame structure.

Advantageously, lead frame 20 is a unitary structure. By "unitary" it is meant that the lead frame 20 is formed from a single structure, such as a lead frame strip. With this arrangement, tighter manufacturing tolerances can be achieved than otherwise possible with conventional configurations that require multiple, sometimes manual, alignment steps, thereby permitting more repeatable and accurate current sensing results. By having the first mold material 60 and second mold material 70 share the same lead frame 20, better control of the coplanarity of the leads as well as the active area depth can be achieved.

During manufacture, lead frame 20 is formed from a coplanar sheet or strip of metal that is patterned (e.g., stamped, etched) to provide the desired lead frame features (e.g., leads 30a-30f, leads 40a-40d, paddle 50, tie bars 32, and dam bars 36a, 36b). Generally, a plurality of lead frames like lead frame 20 are formed from the same metal sheet and dam bars 36a, 36b and tie bars 32 hold together the lead frame 20 with other lead frames (not shown). Once the current sensor 10 is fabricated (e.g., according to FIGS. 3-8), the current sensor 10 is separated (i.e., singulated) from other sensors (not shown) formed from the same lead frame material as discussed below. The thickness of the lead frame 20 can vary.

Figure 4:
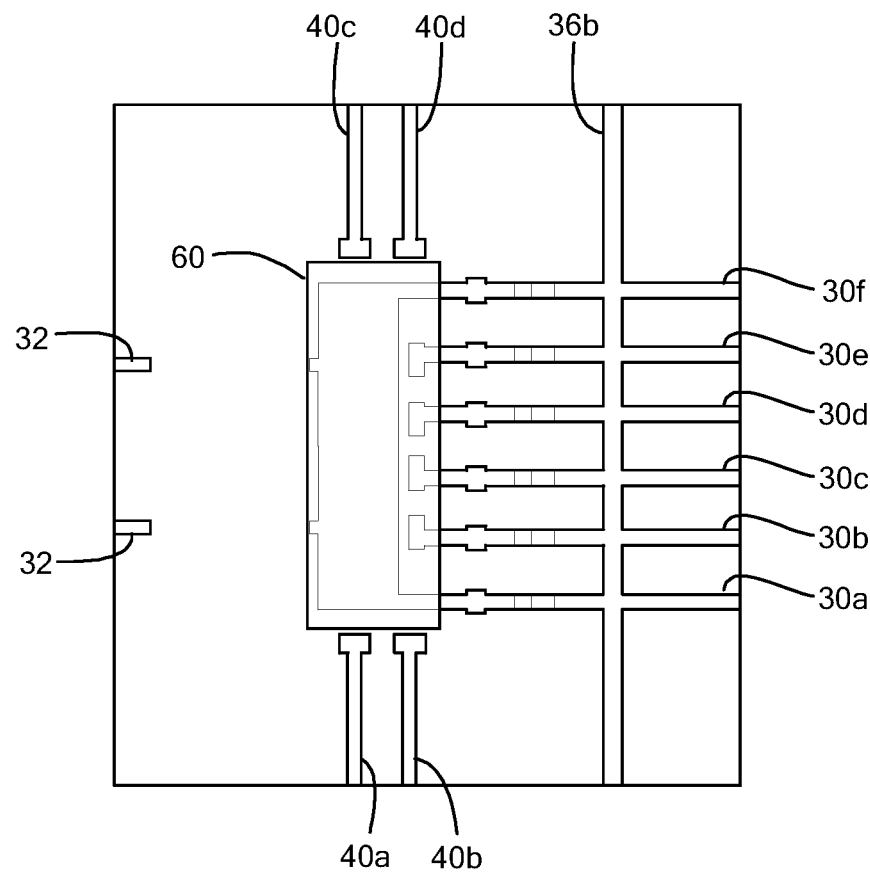
FIG. 4 is a plan view of the lead frame, die and the first mold material at a stage of manufacture of the current sensor IC of FIG. 1 after a dam bar of the lead frame is removed from the primary package and the primary package is down set.

Referring also to FIG. 4, lead frame 20 is shown at a later stage of manufacture of the current sensor 10. In FIG. 4, (although not visible in this view since it is attached to the "bottom" surface of the paddle 50) the semiconductor die 54 is attached to the paddle 50. Various materials and techniques are possible for attaching the die 54 to the paddle 50, including use of an adhesive tape or epoxy for example.

Also in the structure of FIG. 4 (although not visible in this view since it is on the bottom surface of the paddle), the die 54 is attached to one or more leads 30a-30f (such as with wire bonds 58, FIG. 2). The first mold material 60 is molded to enclose the die 54 and paddle 50. Also, in the structure of FIG. 4, one of the dam bars 36a is removed to permit first leads 30a-30f to be formed (i.e., bent). Thus, the primary package structure (FIG. 2) has been fabricated in FIG. 4. And although not shown in this view, first mold material 60 can have tapers 62 (FIG. 2) to facilitate removal from the mold chase.

Figure 4A:
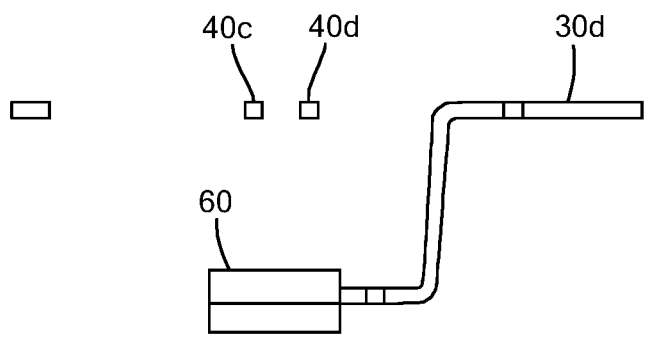
FIG. 4A is a simplified side view of the structure of FIG. 4.

Referring also to the simplified side view of FIG. 4A, the lead frame 20 is formed (i.e., bent) to provide the above-described down set of the die paddle 50, as shown. As noted above, the down set distance (e.g., distance 78 in FIG. 1B) is based on the creepage and active area depth requirements of the sensor 10.

Figure 5:
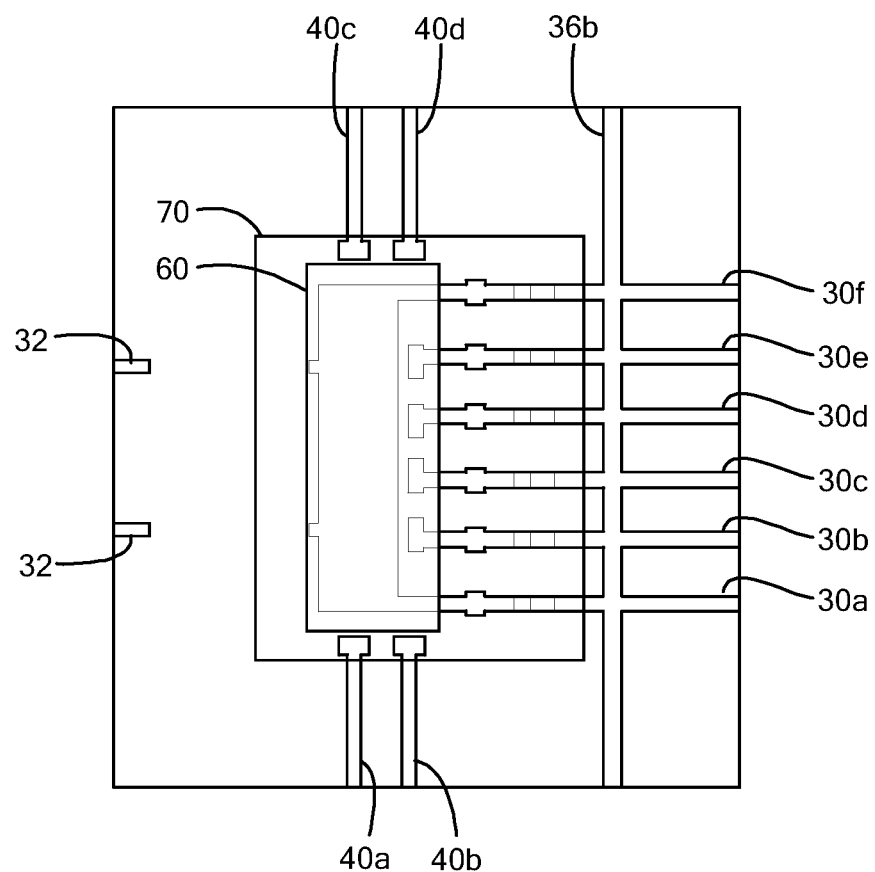
FIG. 5 is a plan view of the lead frame, die, first mold material, and second mold material at a stage of manufacture of the current sensor IC of FIG. 1.
Figure 5A:
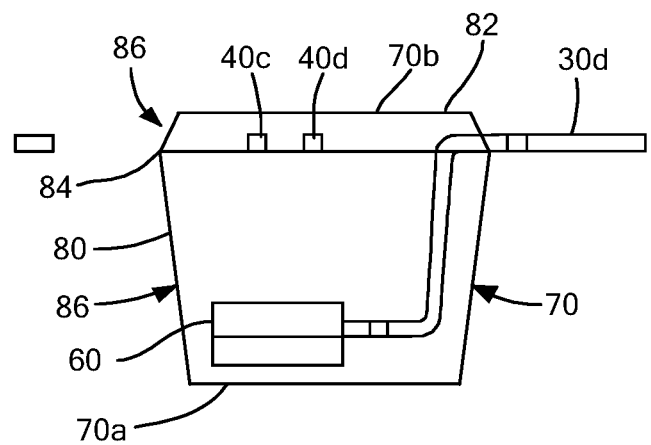
FIG. 5A is a simplified side view of the structure of FIG. 5.

Referring also to FIG. 5, at a later stage of manufacture of the current sensor 10, the second mold material 70 is molded to enclose at least a portion of the first mold material 60 and here, to fully enclose the first mold material as can be seen from the simplified side view of FIG. 5A. As can be seen in FIG. 5A, the second mold material 70 includes first portion 80 and second portion 82 meeting at junction, or parting line 84. The molding process by which the second mold material 70 is formed is described further below in connection with FIG. 8. Suffice it to say here that, preferably the first and second portions 80, 82 have tapers 86 to facilitate removal from the mold chase.

Figure 6:
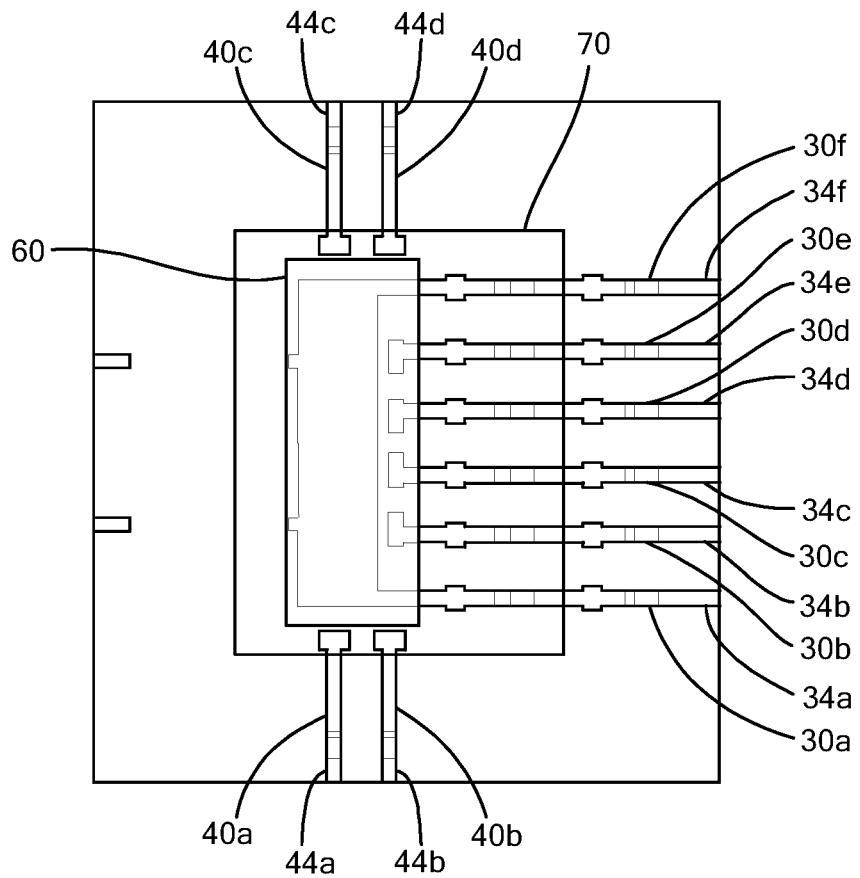
FIG. 6 is a plan view of the lead frame, die, first mold material, and second mold material at a stage of manufacture of the current sensor IC of FIG. 1 after a dam bar of the lead frame is removed from the secondary package and an outside lead is up set for surface mount attachment.

Referring also to FIG. 6, at a still later stage of manufacture of the current sensor 10, dam bar 36b is removed. Also shown in FIG. 6 and in the simplified side view of FIG. 6A, the terminal ends 34a-34f of the first leads 30a-30f and the terminal ends 44a-44d of the second leads 40a-40d are bent and plated to permit surface mount attachment to a printed circuit board or other substrate in use. As noted above, while leads 44a-44d are not electrically connected to sensor circuitry, they are instead provided to enhance mechanical mounting stability when the IC is attached to a circuit board in use (FIG. 9).

Figure 7:
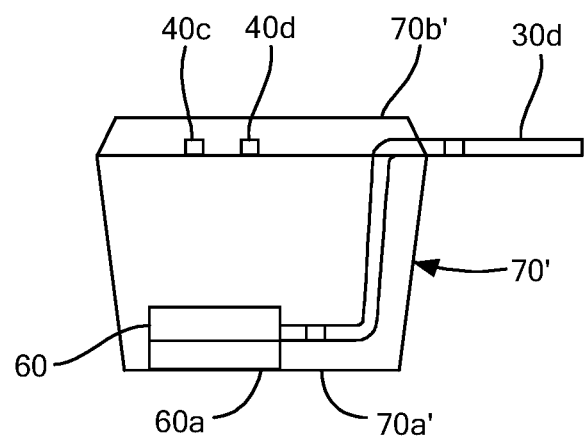
FIG. 7 is a simplified side view of an alternative lead frame, die, first mold material, and second mold material structure, similar to the structure of FIG. 5A but differing in that the primary package is further down set in the embodiment of FIG. 7.

Referring also to FIG. 7, an alternative current sensor is substantially similar to the sensor of FIG. 5A and thus, like reference numbers are used for like elements. The sensor of FIG. 7 differs from the sensor of FIG. 5A only in that the second mold material 70' does not fully enclose the first mold material 60. Rather, a surface 60a of the first mold material 60 is exposed and so is flush with the surface 70a' of the second mold material 70'. This configuration can be advantageous in order to further reduce the active area depth by permitting the active surface 54a of the die 54 to be even closer to the conductor in use.

Figure 8:
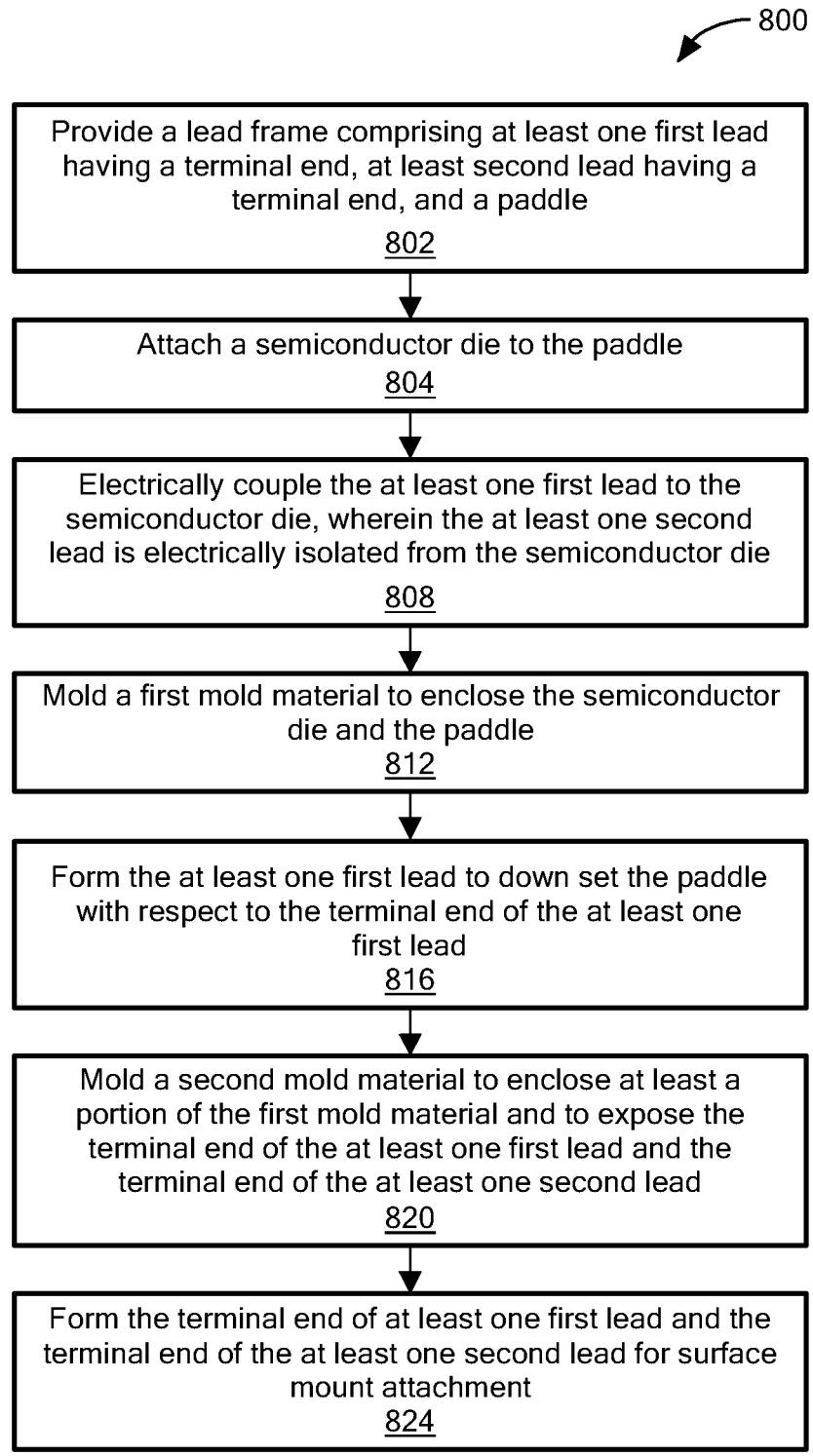
FIG. 8 is a flow diagram illustrating an example manufacturing process for the current sensor IC of FIG. 1.

Referring also to FIG. 8, a flow diagram illustrates an example manufacturing process 800 for the current sensor IC 10, beginning at block 802 with providing lead frame 20 including at least one first lead, such as leads 30a-30f, at least one second lead, such as leads 40a-40d, and a paddle, such as paddle 50, as shown in FIG. 3.

At block 804, a semiconductor die, such as die 54, is attached to the paddle 50 and in block 808, at least one first lead is electrically coupled to the die. For example, one or more leads 30a-30f can be coupled to bond pads of the die by wire bonds 58 (FIG. 2).

At block 812, first mold material 60 is molded to enclose the die 54 and paddle 50 so as to provide the primary package 200 of FIG. 2. Various molding techniques are possible, including but not limited to injection molding, compression molding, transfer molding, and/or potting, with various materials suitable to electrically isolate and mechanically protect the device. Suitable materials for the mold material 60 include thermoset and thermoplastic mold compounds and other commercially available IC mold compounds.

Referring also to FIG. 2, in the example embodiment, the first mold material 60 can be formed by a transfer molding process, in which the subassembly including the lead frame 20 and die 54 (with the die attached to the lead frame by wire bonds 58) is positioned in a chase including mated cavities. Mold material 60 is injected into the mated cavities through a gate, or opening to fill the cavities. After sufficient time has passed, the mold material 60 is partially cured and then the mold cavities are separated, and the molded body 60 is "ejected" from the cavities as can be facilitated by tapers 62 of the first and second portions 66, 68 of mold material 60, FIG. 2. The molded body 60 is then fully cured at high temperature to improved mechanical strength of the molded body.

Once the primary package 200 is fabricated, multiple portions of dam bar 36a are removed, then first leads 30a-30f are formed (i.e., bent or pushed down from the original plane of the lead frame 20) at block 816 so as to generate the structure shown in FIGS. 4 and 4A. More particularly, the tie bars 32 are trimmed along a line 38 (FIG.

3), following which the molded primary package is pushed down to achieve the down set as can be seen in FIG. 4A.

At block 820, the second mold material 70 is molded to enclose at least a portion of the first mold material 60 and to expose the terminal ends 34a-34f of leads 30a-30f and the terminal ends 44a-44d of leads 40a-40d. For example, the second mold material 70 can be formed by transfer molding, in which the subassembly shown in FIGS. 4 and 4A is positioned in a chase including mated cavities. Mold material 70 is injected into the mated cavities through a gate, or opening to fill the cavities. After sufficient time has passed, the mold material 70 is partially cured and then the mold cavities are separated, and the molded body 70 is "ejected" from the cavities. The molded body 70 is then fully cured at high temperature to improved mechanical strength of the molded body. Removal of the mold material 70 from the chase can be facilitated by tapers 86 of the first and second portions 80, 82 of mold material 70 (FIG. 5A).

The resulting structure is shown in FIGS. 5 and 5A for example, in which the first and second portions 80, 82 meet at junction 84.

Figure 6A:
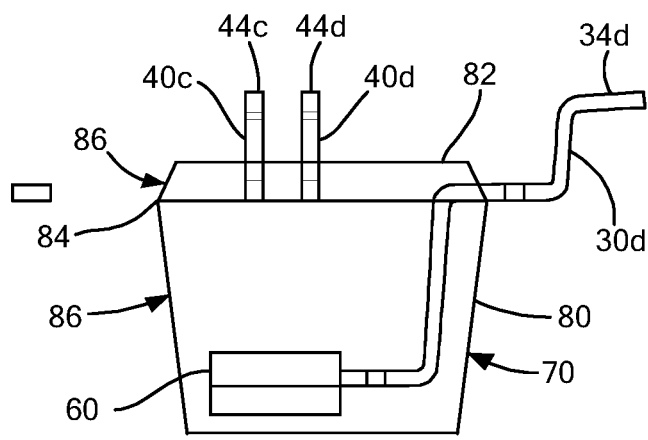
FIG. 6A is a simplified side view of the structure of FIG. 6.

Thereafter at block 824, multiple portions of dam bar 36b are removed, then terminal end 34a-34f of the first leads 30a-30f and terminal ends 44a-44d of second leads 40a-40d are processed according to the desired mounting technique. The illustrated terminal ends 34a-34f, 44a-44d that have been plated are bent to permit surface mount attachment to a printed circuit board (FIG. 9A) or other suitable substrate, as shown in FIGS. 6 and 6A for example.

Figure 9:
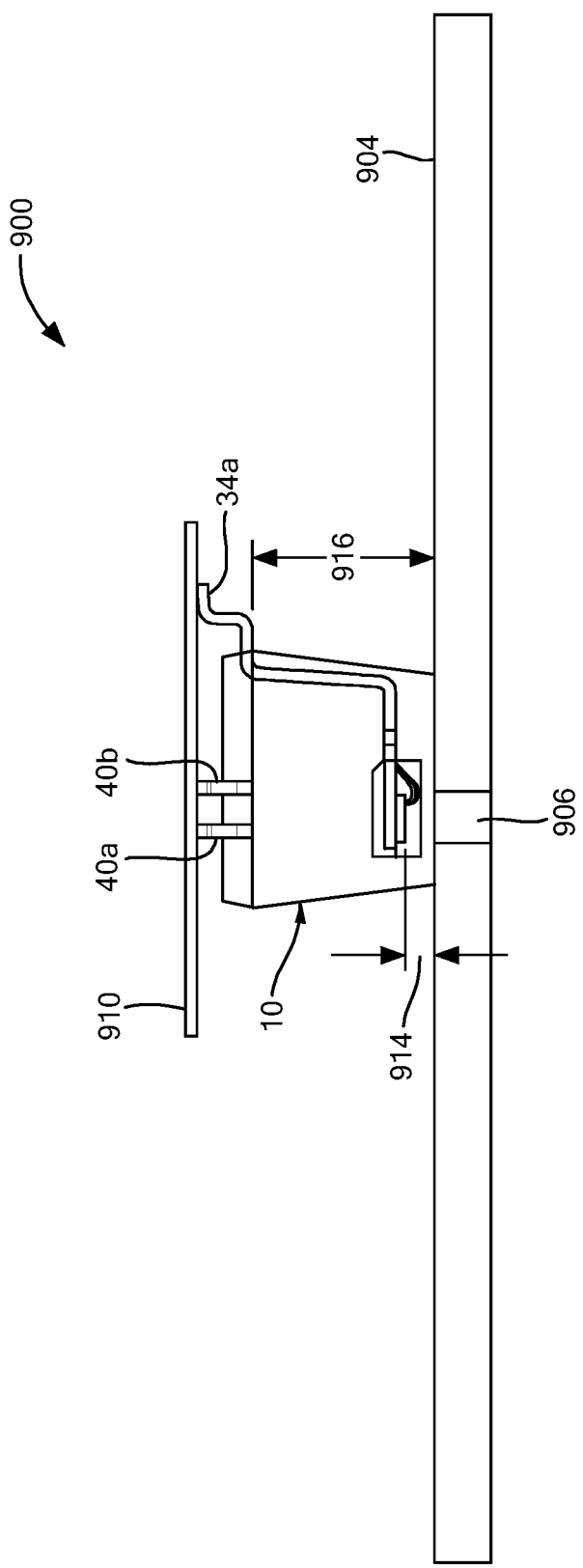
FIG. 9 is a side view of an example current sensor system including the current sensor IC of FIG. 1 secured to an external conductor.
Figure 9A:
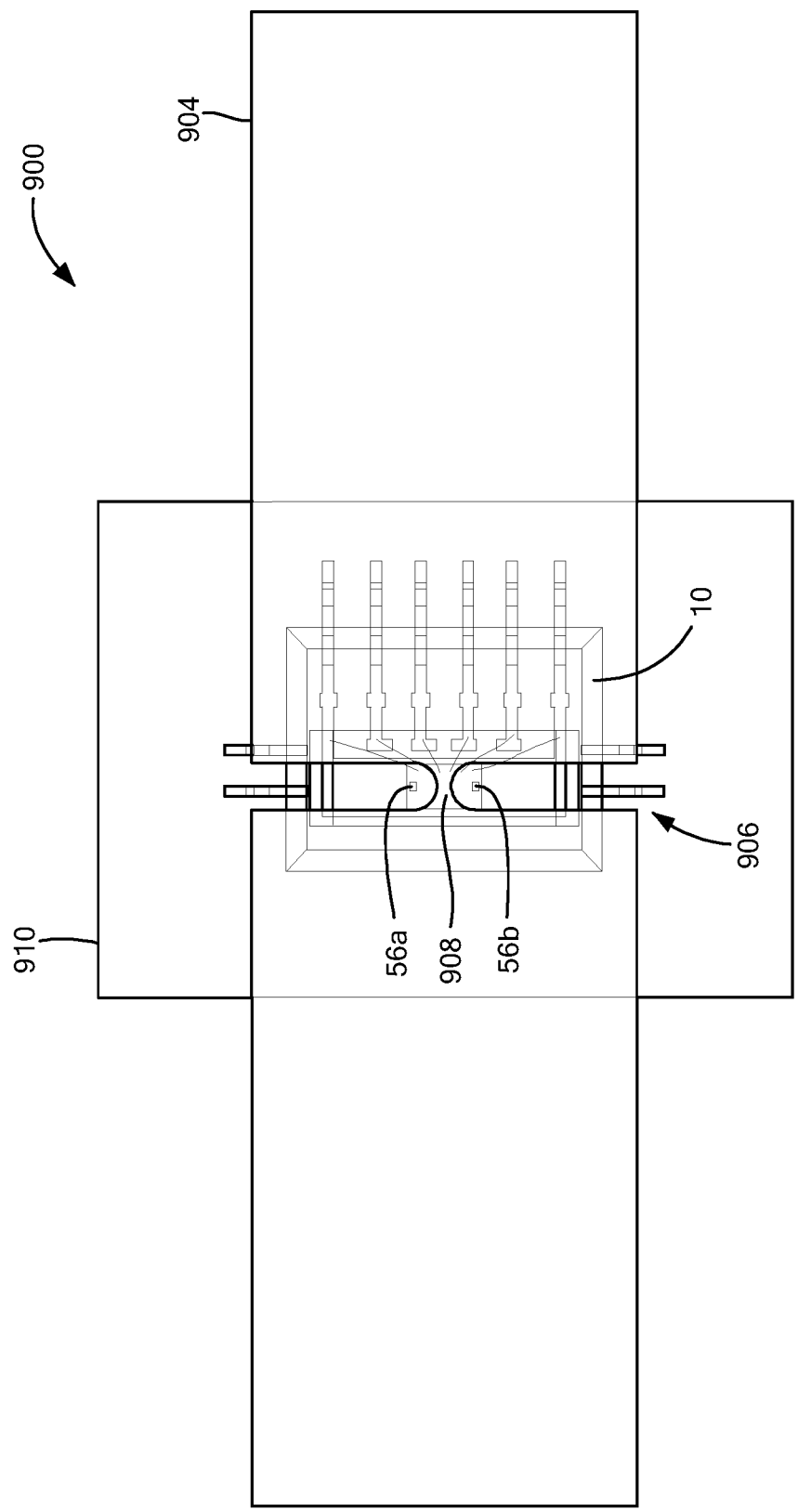
FIG. 9A is a plan view of the current sensor system of FIG. 9.

Referring also to FIGS. 9 and 9A, example current sensor system 900 includes the current sensor IC 10 (FIGS. 1, 1A, 1B) secured to an external current conductor 904 and printed circuit board 910 or other suitable substrate in use. FIG. 9A is a plan view of the current sensor system 900 viewed from the top of the assembly in FIG. 9.

Conductor 904 may be formed from a conductive material, such as copper. In some embodiments, conductor 904 may be provided in the form of a bus bar or a flat conductor. Features of the current conductor 904 can include notches 906 to form a narrowed, neck region 908 of the conductor with which the current sensor 10 is aligned in use, as shown in FIG. 9A. More particularly, in some applications, it may be desirable to align sensor 10 with the conductor 904 such that the sensing elements 56a, 56b are positioned on either side of the narrowed neck region 908, as shown. Narrowed region 908 can improve the coupling factor to the conductor.

Various structures and configurations are suitable for securing the current sensor 10 to conductor 904. For example, one or more clips, adhesive or adhesive tape, or mechanical securing structures may be used. By way of a non-limiting example, clips can retain the printed circuit board 910 in secure attachment to the conductor 904 and may include a thermally conductive material to transfer heat away from the printed circuit board. As another example, one or more pegs or other protrusions can be molded on the surface 70a of mold material 70 for mating with complementary holes in the conductor 904.

Printed circuit board 910 permits electrical or other connection to circuits and systems external to the current sensor 10. For example, leads 34a-34f (FIG. 1) can be electrically connected to signal traces on printed circuit board 910 such as with surface mount connection. Leads 40a-40d can be mechanically secured to printed circuit board 910, but without further electrical connection within the current sensor 10 since, as explained above, leads 40a-40d can be provided for purposes of mechanical stability.

Distance 914 corresponds to the active area depth of the system (i.e., the distance between the sensing elements 56a, 56b and the current conductor 904). Distance 916 corresponds to the creepage distance (i.e., the distance between external conductor 904 and the exposed portion of leads through the second mold material 70).

Figure 10:
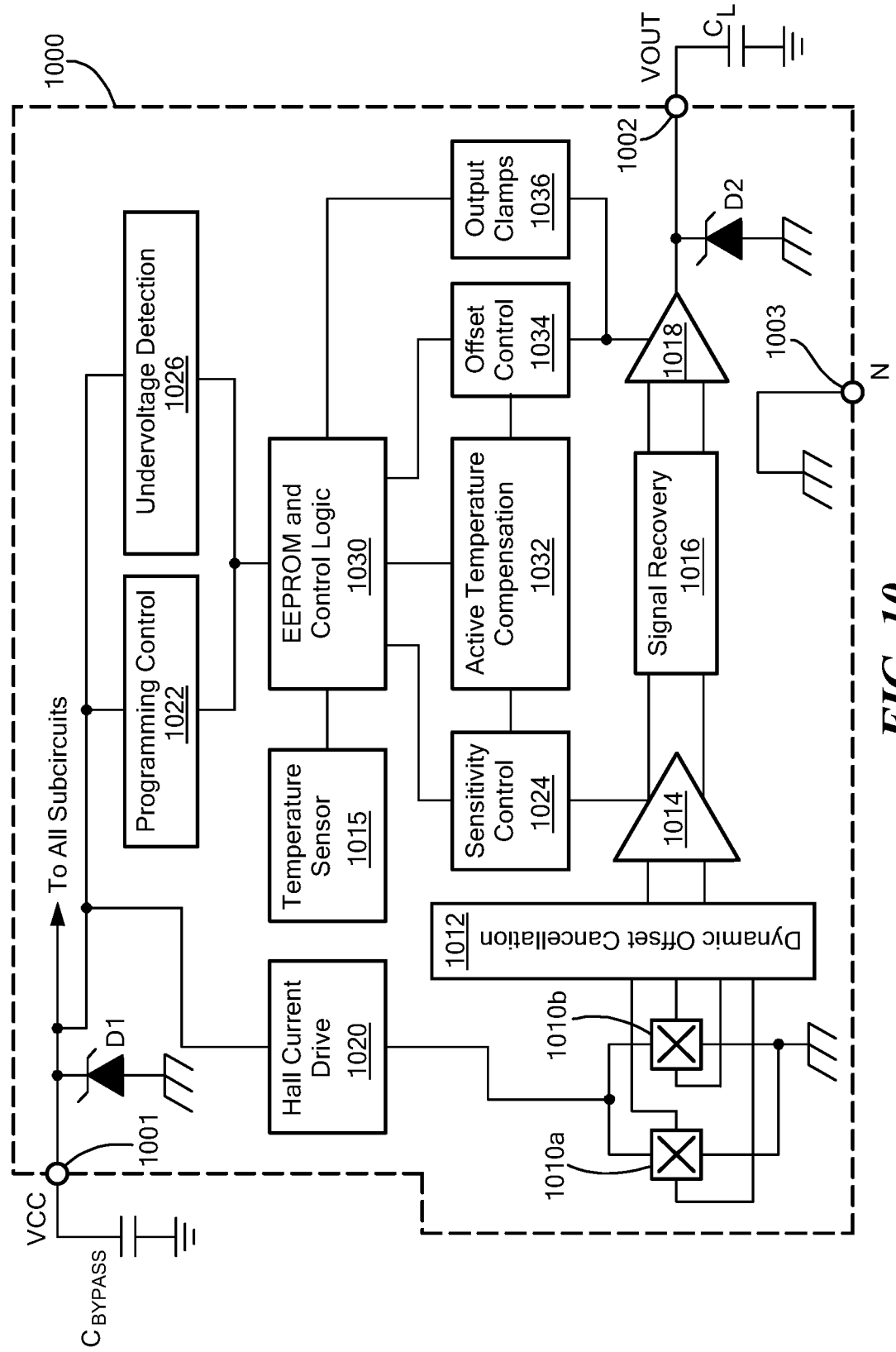
FIG. 10 is a schematic block diagram of an example current sensor packaged according to the disclosure.

Referring to FIG. 10, a schematic block diagram of an example current sensor 1000 as can be manufactured as described above, includes one or more magnetic field sensing elements, and here two sensing elements 1010a, 1010b. Sensing elements 1010a, 1010b can be Hall effect elements or other magnetic field transducer element types. It will be appreciated that sensor 1000 is presented as a non-limiting example of circuitry suitable for sensor 10.

Use of two or more sensing elements 1010a, 1010b permits differential magnetic field sensing, as may be advantageous to improve immunity (i.e., insensitivity) to common-mode stray magnetic fields. The output of the sensor VOUT is proportional to $\Delta B = B_R - B_L$ where $B_R$ represents magnetic field incident on one of the sensing elements (e.g., so-called "right" sensing element 1010b) and $B_L$ represents magnetic field incident on the other one of the sensing elements (e.g., so-called "left" sensing element 1010a). The sensor output VOUT is also affected by the sensitivity, α, of the signal path to magnetic field and can be represented as follows:

$$V\text{OUT} = \alpha \times \Delta B \tag{1}$$

The relationship between the conductor current to be measured and the differential field ΔB can be represented by a coupling factor, CF as follows:

$$\Delta B = \text{CF} \times I \tag{2}$$

It will be appreciated that coupling factor CF corresponds to coupling between a given current sensor and a proximate conductor.

While differential sensing may be implemented, for example using two sensing elements as shown, in some embodiments, the current sensor can include only a single sensing element. Furthermore, it will also be appreciated that differential sensing can be implemented with more than two sensing elements and can include the use of sensing elements arranged in a bridge configuration.

Example current sensor 1000 has three pins in this embodiment, including a VCC (supply voltage) pin 1001, a VOUT (output signal) pin 1002, and a GND (ground) pin 1003. The VCC pin 1001 is used for the input power supply or supply voltage for the current sensor 1000. A bypass capacitor, $C_{BYPASS}$, can be coupled between the VCC pin 1001 and ground. The VCC pin 1001 can also be used for programming the current sensor 1000. The VOUT pin 1002 is used for providing the output signal for the current sensor 1000 to circuits and systems (not shown) and can also be used for programming. An output load capacitance $C_L$ is coupled between the VOUT pin 1002 and ground. The example current sensor 1000 can include a first diode D1 coupled between the VCC pin 1001 and chassis ground and a second diode D2 coupled between the VOUT pin 1002 and chassis ground.

Magnetic field signals generated by the magnetic field sensing elements 1010a, 1010b are coupled to a dynamic offset cancellation circuit 1012, which is further coupled to an amplifier 1014. The amplifier 1014 is configured to generate an amplified signal for coupling to the signal recovery circuit 1016. Dynamic offset cancellation circuit 1012 may take various forms including chopping circuitry and may function in conjunction with offset control 1034 to remove offset that can be associated with the magnetic field sensing elements 1010a, 1010b and/or the amplifier 1014. For example, offset cancellation circuit 1012 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 1000 to regulate the supply voltage.

A programming control circuit 1022 is coupled between the VCC pin 1001 and EEPROM and control logic 1030 to provide appropriate control to the EEPROM and control logic circuit. EEPROM and control logic circuit 1030 determines any application-specific coding and can be erased and reprogrammed using a pulsed voltage. A sensitivity control circuit 1024 can be coupled to the amplifier 1014 to generate and provide a sensitivity control signal to the amplifier 1014 to adjust a sensitivity and/or operating voltage of the amplifier. An active temperature compensation circuit 1032 can be coupled to sensitivity control circuit 1024, EEPROM and control logic circuit 1030, and offset control circuit 1034. The offset control circuit 1034 can generate and provide an offset signal to a push/pull driver circuit 1018 (which may be an amplifier) to adjust the sensitivity and/or operating voltage of the driver circuit. The active temperature compensation circuit 1032 can acquire temperature data from EEPROM and control logic circuit 1030 via a temperature sensor 1015 and perform necessary calculations to compensate for changes in temperature, if needed. Output clamps circuit 1036 can be coupled between the EEPROM and control logic 1030 and the driver 1018 to limit the output voltage and for diagnostic purposes. For example, if the total output range can be from 0V to 5V, for magnetic fields from 0G to 1000 G, it may be desired to use a clamp at 0.5V for any field below 100 G. For example, it may be known that below 100 G, the sensor 1000 does not generate a trustable signal. Hence, if the IC output is 0.5V, it is evident that the measurement is not valid and cannot be trusted. Or clamps at 1V and 4V could be used and the 0-1V and 4-5V ranges can be used for communicating diagnostic information (e.g., 4.5V on the output could indicate "Hall plate is dead" and 0.5V could indicate "Undervoltage VCC detected", etc.). An undervoltage detection circuit 1026 can operate to detect an undervoltage condition of the supply voltage level VCC. It will be appreciated that while FIG. 10 shows an example current sensor 1000 primarily as a digital implementation, any appropriate current sensor can be used in accordance with the present disclosure, including both digital, analog, and combined digital and analog implementations.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A method of manufacturing a current sensor integrated circuit (IC) comprising:
   providing a lead frame comprising at least one first lead having a terminal end, at least one second lead having a terminal end, and a paddle;
   attaching a semiconductor die to the paddle;
   electrically coupling the at least one first lead to the semiconductor die, wherein the at least one second lead is electrically isolated from the semiconductor die;
   molding a first mold material to enclose the semiconductor die and the paddle;
   forming the at least one first lead to down set the paddle with respect to the terminal end of the at least one first lead;
   molding a second mold material to enclose at least a portion of the first mold material and to expose the terminal end of the at least one first lead and the terminal end of the at least one second lead; and
   forming the terminal end of the at least one first lead and the terminal end of the at least one second lead for surface mount attachment.

2. The method of claim 1 wherein providing the lead frame comprises providing the lead frame from a unitary, coplanar lead frame strip.

3. The method of claim 1 wherein the lead frame further comprises at least two dam bars configured to attach the lead frame to one or more lead frames of other current sensor ICs, wherein the method further comprises removing at least one dam bar after molding the first mold material and before forming the at least one first lead to down set the paddle with respect to the terminal end of the at least one first lead.

4. The method of claim 3 further comprising removing at least one dam bar after molding the second mold material.

5. The method of claim 1 wherein molding the second mold material to enclose at least a portion of the first mold material comprises enclosing all surfaces of the first mold material.

6. The method of claim 1 wherein molding the second mold material to enclose at least a portion of the first mold material comprises exposing a surface of the first mold material.

7. The method of claim 1 wherein molding the first mold material to enclose the semiconductor die and the paddle comprises:
   placing a portion of the lead frame and the semiconductor die into a first chase comprising a first cavity and a second cavity; and
   introducing the first mold material through an opening in the first chase, wherein the at least one first lead extends external to the first mold material at a junction between the first cavity and the second cavity.

8. The method of claim 7 wherein molding the second mold material comprises:
   placing the lead frame and the first mold material into a second chase comprising a first cavity and a second cavity; and
   introducing the second mold material through an opening in the second chase, wherein the at least one first lead and the at least one second lead extend external to the second mold material at a junction between the first cavity and the second cavity.

\* \* \* \* \*

UNITED STATES PATENT AND TRADEMARK OFFICE
CERTIFICATE OF CORRECTION

PATENT NO. : 11,519,939 B2  
APPLICATION NO. : 17/472769  
DATED : December 6, 2022  
INVENTOR(S) : Shixi Louis Liu et al.

It is certified that error appears in the above-identified patent and that said Letters Patent is hereby corrected as shown below:

In the Specification

Column 2, Line 20 delete "material configured" and replace with --material is configured--.

Column 4, Line 22 delete "up set" and replace with --upset--.

Column 5, Line 53 delete "an side" and replace with --a side--.

Column 5, Line 60 delete "downward the" and replace with --downward in the--.

Column 9, Line 24 delete "end 34a-34f" and replace with --ends 34a-34f--.

Column 10, Line 30 delete "AB" and replace with --ΔB--.

Signed and Sealed this  
Twenty-eighth Day of November, 2023

Katherine Kelly Vidal  
*Director of the United States Patent and Trademark Office*